United States Patent [19]
Price

[11] Patent Number: 4,985,864
[45] Date of Patent: Jan. 15, 1991

[54] STATIC RANDOM ACCESS MEMORY HAVING COLUMN DECODED BIT LINE BIAS

[75] Inventor: Jack A. Price, Aloha, Oreg.

[73] Assignee: VLSI Technology, Inc., San Jose, Calif.

[21] Appl. No.: 370,542

[22] Filed: Jun. 23, 1989

[51] Int. Cl.$^5$ .............................................. G11C 7/00
[52] U.S. Cl. .................................. 365/189.06; 365/154; 365/203
[58] Field of Search ................... 365/189.06, 154, 156, 365/190, 203

[56] References Cited

U.S. PATENT DOCUMENTS 4,161,040  7/1979  Satoh .................................... 365/203
4,829,477  5/1989  Suzuki et al. ..................... 365/189.06

OTHER PUBLICATIONS

Kim C. Hardee and Rahul Sud, "A Fault-Tolerant 30 ns/375 mW 16K X 1 NMOS Static RAM", *IEEE Journal of Solid-State Circuits*, vol. SC-16, No. 5, Oct. '81.

*Primary Examiner*—Joseph A. Popek
*Attorney, Agent, or Firm*—Dellett, Smith-Hill and Bedell

[57] ABSTRACT

In a static random access memory formed by an array of rows and columns of memory cells, separate bit lines convey a data bit to or from memory cells of separate columns. Gates controlled by an input row address connect only a single memory cell of each column to the bit lines of the column so that only a single memory cell of the column transmits or receives a data bit on the bit line. Gates controlled by a column address connect the bit lines of only a single column to data input and output circuits. During a write cycle, the memory cell connected to each bit line pair attempts to bias the bit line pair in accordance with the state of its stored data bit, but bit line pairs of non-addressed columns are coupled to a voltage source to prevent a row addressed memory cell of that column from strongly biasing the bit lines. Following the end of a write cycle, a precharge circuit temporarily clamps all bit lines to the voltage source to precharge bit line capacitance. The selective clamping of bit lines of non-addressed columns during the write cycle minimizes a charging current spike produced by the precharge circuit.

10 Claims, 5 Drawing Sheets

STATIC RANDOM ACCESS MEMORY HAVING COLUMN DECODED BIT LINE BIAS

BACKGROUND OF THE INVENTION

The present invention relates to a static random access memory having column decoded bit line bias.

A typical static random access memory includes an array of rows and columns of memory cells, each cell storing a data bit. During either a memory read or a memory write cycle, input row and column addresses identify the row and column of the particular memory cell with respect to which it is desired to read out or store a data bit. During a write cycle, a data input circuit receives a data bit from an external bus and passes it to the addressed memory cell for storage therein. During a data read cycle, a data output circuit receives a stored data bit from an addressed memory cell and passes it to the external bus.

Each column of memory cells uses a pair of "bit lines" to convey a data bit between cells of the column and the data input and output circuits. The polarity of bias across the bit lines represents the state of the data bit. However, gates controlled by the row address connect only one cell in each column to the column bit lines, and gates controlled by the column address connect only the bit lines of one column to the data input and output circuits. Thus, during a read or write cycle, only the memory cell residing both in the addressed row and in the addressed column is connected to a data output or input circuit and only that one cell transmits or receives a data bit via the bit lines.

Each memory cell is a relatively weak bistable latch, and when connected to the bit lines, a memory cell attempts to bias the bit lines to a polarity determined by the state of its stored bit. However, the data input circuit has a more powerful output stage, and when connected to bit lines during a write cycle, the data input circuit biases the bit lines to a polarity determined by the state of a memory input bit regardless of the state of a bit stored by the row addressed memory cell connected to the bit lines. The row addressed memory cell responds by setting the state of its stored bit to match the state of the bit line bias.

During a write cycle, the data input circuit biases only the bit lines of the addressed column. But one memory cell of each non-addressed column of the array is connected to the column bit lines during the write cycle, and each of these cells biases its column bit lines in accordance with the state of its stored bit. During a subsequent memory read cycle, the next cell connected to a pair of bit lines may have to change the polarity of the bias on those bit lines. Since the bit lines have inherent capacitance, the extra time required to charge or discharge this capacitance to overcome the bit line prebias reduces the memory access speed.

To improve memory access speed, static random access memories typically include a "precharge" circuit that temporarily clamps all bit lines to a high logic level at the end of the write cycle to remove bit line bias established during the write cycle. This enables an addressed memory cell to more quickly bias its bit lines to the appropriate state during a subsequent read cycle. However, in restoring the charge on all the bit lines of the memory, the precharge circuit produces a large current spike, particularly in large memories having many bit lines. This current spike can cause excessive noise in a memory chip and in the electronic system using the memory chip, and the current spike contributes to rated memory chip power consumption.

SUMMARY OF THE INVENTION

The present invention relates to a static random access memory formed by an array of rows and columns of memory cells, each memory cell storing a data bit. Each column of memory cells uses a pair of bit lines to convey a bit between cells of the column and a corresponding data input/output circuit for that column, wherein the polarity of bias on the bit lines indicates the state of a data bit. Gates controlled by a row address connect only a single row addressed cell of each column to the bit lines of that column.

During a read or a write cycle, all row addressed cells attempt to bias their respective column bit lines to polarities representing their internally stored bit states; however, during a read cycle, input/output circuits connect the bit lines of only a single addressed column to a data output circuit. The data output circuit places an output bit on an external bus line of a state determined by the bias on its input bit lines.

During a write cycle, the input/output circuits connect only one set of addressed column bit lines to a memory data input circuit and the memory data input circuit biases the bit lines with a polarity determined by an input on the external bus line. The row addressed memory circuit connected to those bit lines responds by setting the state of its stored bit to match the bias on the bit lines.

Following a write cycle, a precharge circuit temporarily clamps all bit lines to a voltage source to remove bias from the bit lines, but later, the precharge circuit unclamps the bit lines so that the row addressed memory cells can quickly bias column bit lines.

In accordance with an embodiment of the present invention, input/output circuits clamp the bit lines of non-addressed columns to a voltage source during the write cycle to prevent a row addressed memory cell of that column from substantially controlling bias on the bit lines As a result, a current spike otherwise generated by the precharge circuit at the end of a write cycle is minimized because the inherent capacitance on bit lines of all non-addressed columns is already charged. The precharge circuit need only charge the inherent capacitance of the bit lines of the single column addressed during the preceding write cycle.

It is accordingly an object of the present invention to provide an improved static random access memory that requires minimal charging current during a bit line precharge period.

The concluding portion of this specification particularly points out and distinctly claims the subject matter of the present invention. However, those skilled in the art will best understand both the organization and method of operation of the invention, together with further advantages and objects thereof, by reading the following description in view of the accompanying drawings wherein like reference characters refer to like elements.

DESCRIPTION OF THE PREFERRED EMBODIMENT

Figure 1:
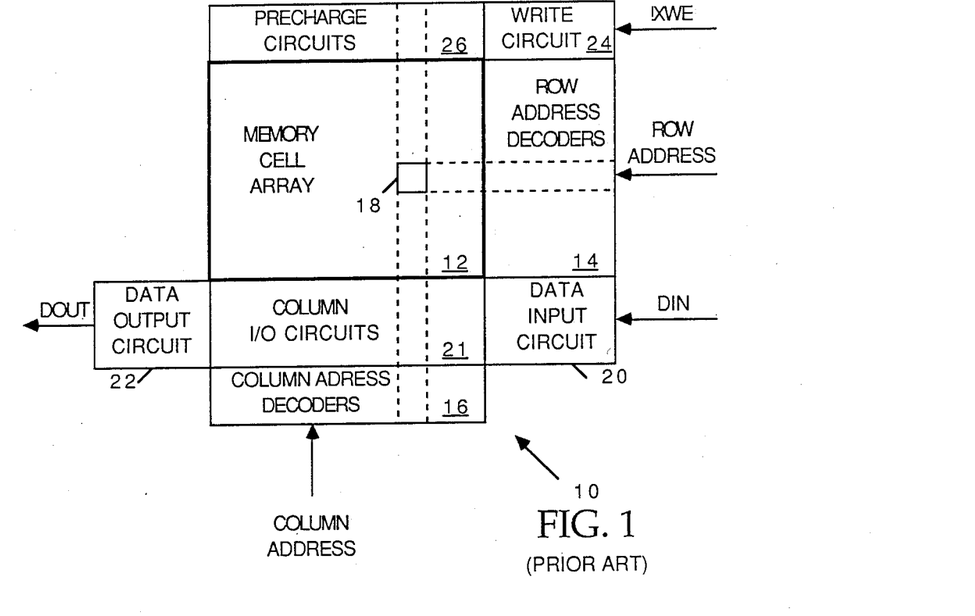
FIG. 1 is a block diagram of a static random access memory of the prior art.

The present invention relates to an improved static random access memory (SRAM). To aid an understanding of the invention, the specification hereinbelow first describes a typical SRAM of the prior art. Referring to FIG. 1, a typical static random access memory 10 includes a rectangular array 12 of rows and columns of memory cells. Since each memory cell stores a single bit, memory 10 stores bits in each of N × M addressable memory cells where N is the number of cell columns and M is the number of cell rows. During a memory read or write cycle, a set of decoders 14 decodes a row address to select one row of memory cells of array 12, and another set of decoders 16 decodes a column address to select one column of memory cells. The cell 18 residing in both the selected row and column stores or indicates the input or output bit.

Memory 10 also includes a set of column I/O circuits 21, a separate I/O circuit 21 corresponding to each array column and providing data read and write access to the memory cells of the corresponding column. Each column address decoder 16 selects a corresponding cell column by activating the corresponding column I/O circuit 21. During a write cycle, a data input circuit 20 transmits a data bit from an external bus through the activated column I/O circuit 21 to all of the memory cells of the column. However, only the particular cell 18 included in both the selected row and the selected column stores the bit. During a read cycle, the activated column I/O circuit 21 transmits a bit stored in the selected memory cell 18 to an external bus via a data out circuit 22.

Memory 10 also includes a set of precharge circuits 26, one corresponding to each array column. Each Precharge circuit 26 controls loading of input/output "bit lines" that convey data bits between the activated column I/O circuit and the row addressed cell of the selected cell column. An external write enable signal !XWE supplied to a write circuit 24 controls whether each precharge circuit 26 loads the bit lines for a read cycle or a write cycle. For purposes explained in more detail hereinbelow, each precharge circuit 26 responds to an external write precharge signal WP by temporarily clamping the bit lines to a high logic level voltage source VDD during a first portion of each cycle following a write cycle.

Figure 2:
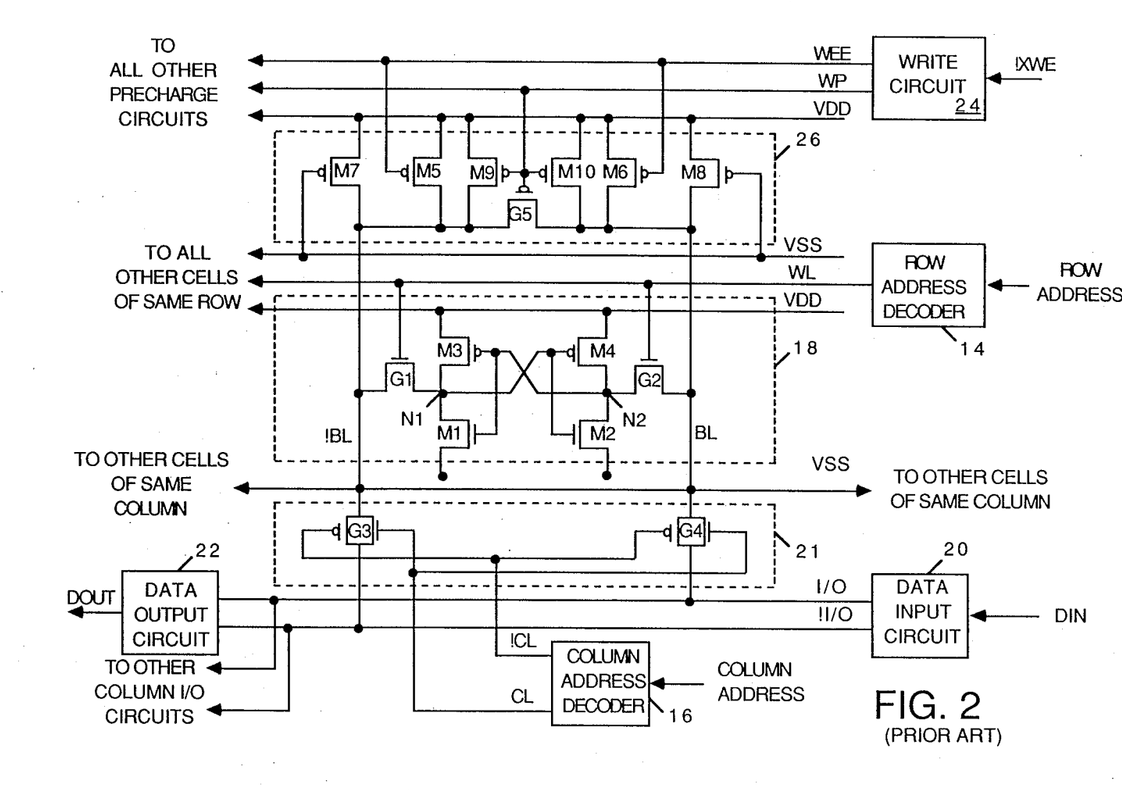
FIG. 2 is a combined block and schematic diagram showing in more detail a portion of the prior art memory of FIG. 1.

FIG. 2 illustrates in more detail a portion of memory 10 including one memory cell 18, one column I/O circuit 21 and one precharge circuit 26. Memory cell 18 includes a set of six MOS switching transistors G1, G2 and M1-M4. The drains of pMOS transistors M3 and M4 are tied to voltage source VDD, and the sources of nMOS transistors M1 and M2 are tied to a voltage source VSS. The gate of transistor M4, the source of transistor M3 and the drain of transistor M1 are interconnected at a node N1 while the gate of transistor M3, the source of transistor M4 and the drain of transistor M2 are interconnected at a node N2. The drain and source of nMOS pass gate transistor G1 are respectively tied to node N1 and a column bit line BL, with the drain and source of nMOS pass gate transistor G2 being respectively tied to node N2 and a bit line BL. A word line signal WL produced by row address decoder 14 controls the gates of transistors G1 and G2.

During a read or write cycle, decoder 14 drives WL high when the row address references the array row containing memory cell 18, and drives WL low when the row address references another array row. When WL is high, pass gate transistors G1 and G2 respectively couple bit lines !BL and BL to nodes N1 and N2 wherein the relative potential between nodes N1 and N2 determines the state of a bit stored in cell 18. The stored bit is high if N2 is high and N1 is low. Conversely, the stored bit is low when N1 is high and N2 is low. The WL signal output of each row address decoder 14 is supplied in common to all cells of the row. When G1 and G2 are on, cell 18 attempts to bias BL and !BL to a polarity matching the polarity across nodes N1 and N2. However, when during a write cycle bit lines BL and !BL are biased to opposite polarity by data input circuit 20, the memory cell changes the state of its stored bit.

The precharge circuit 26 corresponding to each array column includes pMOS transistors G5 and M5-M10. The drains of transistors M5-M10 are tied to VDD and the sources of transistors M5, M7, and M9 are connected to !BL, while the sources of transistors M6, M8 and M10 are connected to BL. The drain and source of pass gate transistor G5 are connected to !BL and BL. A write enable signal WEE produced by write circuit 24 in response to !XWE drives the gates of transistors M5 and M6. A write precharge clock signal WP produced by write circuit 24 controls the gates of transistors M9, M10 and G5. The WP and WEE signals are supplied in common to all precharge cells 26 of the memory. Transistors M7 and M8, the gates of which are connected to VSS, are relatively small and are always on to provide a relatively large load impedance between VDD and the bit lines. Transistors M5 and M6 turn on during read cycles to provide additional load current through the bit lines. As discussed in more detail hereinbelow, transistors M9, M10 and G5 briefly turn on after the end of a write cycle to precharge the inherent capacitance of the bit lines.

One I/O circuit 21 is provided for each cell array column. Circuit 21 comprises a CMOS pass gate transistor G3 connected between bit line !BL and a data input/output line !I/O, and a CMOS pass gate transistor G4 connected between bit line BL and a data input/output line I/O. The !BL and BL bit lines are provided to all cells of the same column while input/output lines !I/O and I/O are supplied in common to all column I/O circuits 21 of the array. A separate address decoder 16 corresponding to each column of the array operates complementary column select lines !CL and CL in response to the column address to control the gates of transistors G3 and G4. When the column address references the array column including memory cell 18, the column address decoder 16 corresponding to the column drives !CL low and drives CL high, thereby causing pass gate transistors G3 and G4 to couple bit lines BL and BL to input/output lines !I/O and I/O.

Figure 3:
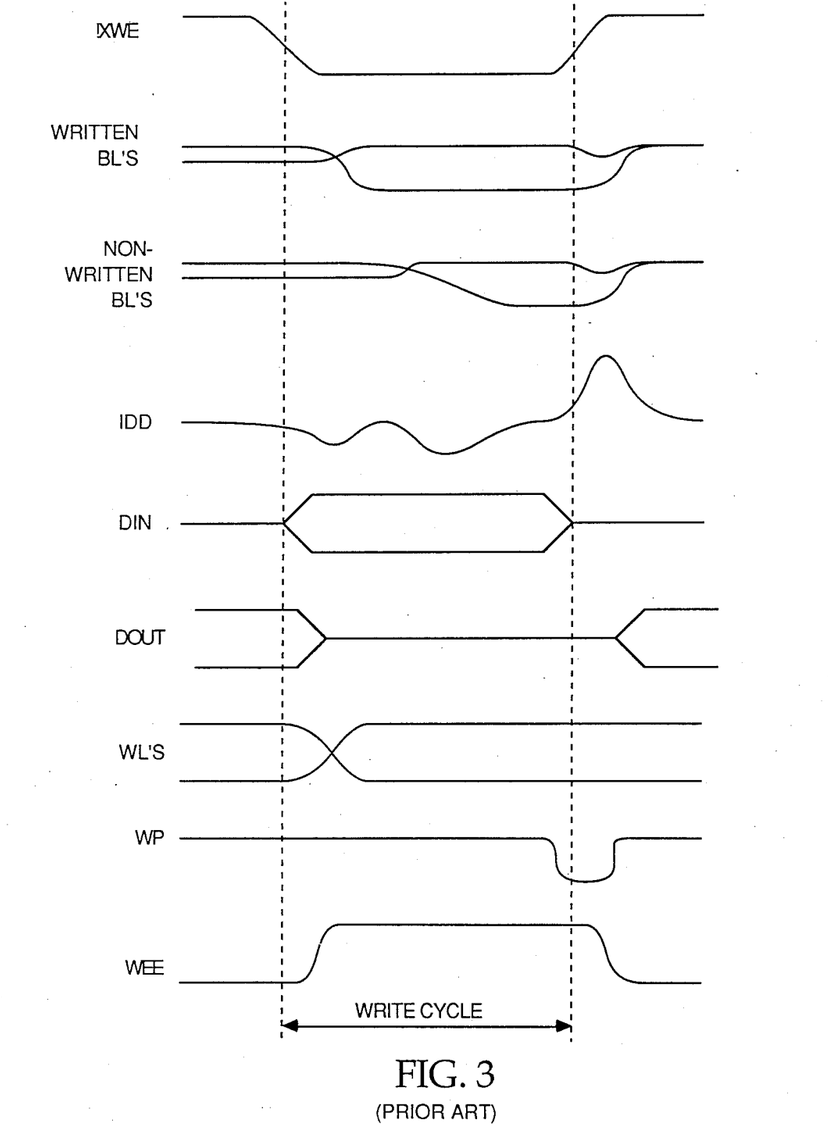
FIG. 3 is a timing diagram illustrating behavior of various signals in the circuit of FIG. 2 during a write cycle and portions of a read cycle.

FIG. 3 is a timing diagram showing how various signals in the circuit of FIG. 2 behave during a write cycle and portions of preceding and succeeding read cycles. Referring to FIGS. 2 and 3, the external write enable signal !XWE is driven low during the write cycle and write circuit 24 responds by driving WEE high to turn off transistors M5, M6, M9 and M10 of every precharge circuit 26. Write circuit 24 also holds WP high during the write cycle so that transistors M9, M10 and G5 are off.

The row address decoder 14 corresponding to the addressed array row drives WL high to turn on pass gate transistors G1 and G2 while the row address decoders corresponding to non-addressed array rows drive their WL outputs low. The column address decoder 16 of the addressed column I/O circuit drives !CL low to turn on pass gate transistors G3 and G4 and non-addressed column decoders drive their !CL outputs high While pass gate transistors G1 and G2 in one cell of each column couple that cell's N1 and N2 nodes to the bit lines !BL and BL of the column, pass gate transistors G3 and G4 of only one addressed I/O circuit 21 couple its bit lines !BL and BL to the input/output lines !I/O and I/O. Thus, nodes N1 and N2 of only a single addressed cell of the array are coupled to !I/O and I/O during the write cycle. An I/O line driver in data input circuit 20 is much stronger than transistors M3 or M4 of cell 18 and transistors M7 and M8 of precharge circuit 26 so that as data circuit 20 pulls down either line !I/O or line I/O depending on the state of input data bit DIN, circuit 20 pulls down one of nodes N1 and N2 of the addressed memory cell 18 The other node N2 or N1 is driven near VDD. Thus, at the end of the write cycle, when transistors G1 and G2 turn off to disconnect memory cell 18 from the bit lines, the state of the bit stored by cell 18 represents the state of the DIN bit supplied to circuit 20.

During a read cycle, column address decoder 16 turns on transistors G3 and G4 of a single addressed array column, and row address decoder 14 turns on transistors G1 and G2 of each cell in a single addressed array row. However, write circuit 24 drives WEE low to turn on transistors M5 and M6 of every precharge circuit 26. One of transistors M1 or M2 of each memory cell of the array is on and the other is off Depending on which transistor M1 or M2 is on, one of nodes N1 and N2 is near VSS and the other is near VDD. The data out circuit 22 sets the state of its output bit DOUT in accordance with the state of an input bit conveyed on the I/O and !I/O lines, which in turn is determined by bias across the single bit line pair of the addressed column coupled to the I/O and !I/O lines through transistors G3 and G4.

During the write cycle, transistors M7 and M8 attempt to drive the bit lines of all the nonaddressed columns to VDD. However, since the transistors G1 and G2 of all cells in the addressed row are on, and since one transistor M1 or M2 of each non-addressed cell in the addressed row is on, that transistor eventually pulls down one of the bit lines BL or BL!of a non-addressed column. The bit lines of the non-addressed column fall more slowly than the bit lines of the addressed column because transistors M1 and M2 are not as strong as the drivers in data circuit 20 which quickly pull down the bit line of the addressed column. However, in a "worst-case" situation where the write cycle is relatively long, the non-written bit lines may fall nearly to VSS. During a first portion of the following read cycle, write circuit 24 temporarily drives WP low to turn on transistors M9, M10 and G5. These transistors help the relatively weak transistors M7 and M8 to quickly pull bit lines of all columns back up toward VDD by supplying a large charging current to inherent capacitances of the bit lines. This operation shortens the minimum time needed for a read cycle following a write cycle.

FIG. 3 also illustrates the total input current IDD from the VDD power supply A transient portion of this current is proportional to the sum of changes in voltage across inherent circuit capacitance on the bit lines. As a bit line is driven low, capacitance on the bit line discharges and VDD supplies less current. As a bit line swings high, VDD must supply additional current to charge capacitance on the line As shown in FIG. 3, IDD temporarily dips low early during the write cycle as the written bit line voltage falls and again dips low later in the write cycle as voltage across the non-written bit lines fall. Then, during the first part of the read cycle, as transistors M9 and M10 pull the bit lines, VDD supplies a sharp current spike to quickly charge all bit line capacitance.

The current spike at the start of the read cycle following a write cycle can cause unacceptable system and internal circuit noise and contributes substantially to the rated power consumption of the memory. The present invention, in a preferred embodiment thereof, improves the prior art circuit of FIG. 2 to greatly reduce the magnitude of the IDD current spike at the start of the read cycle following a write cycle.

Figure 4:
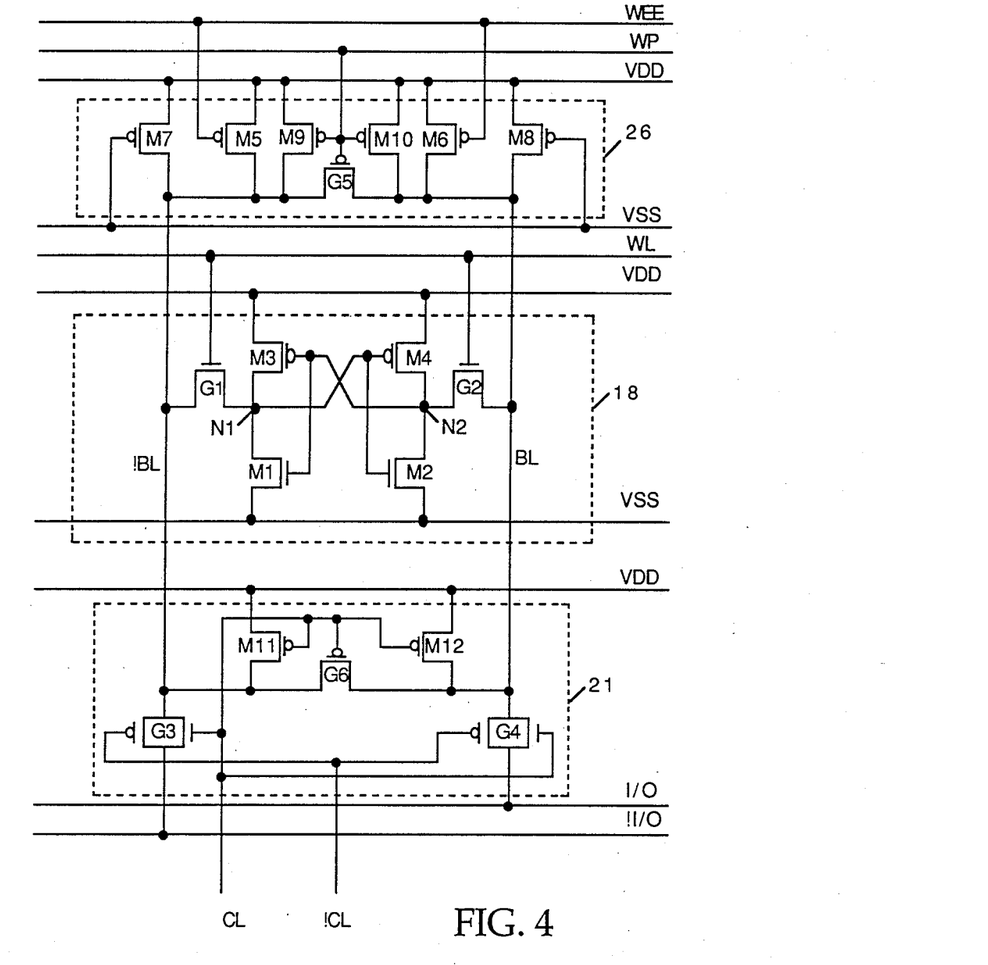
FIG. 4 is a schematic diagram of relevant portions of a memory in accordance with the present invention.

In the preferred embodiment, as illustrated in FIG. 4, the prior art circuit of FIG. 2 is improved by the addition of three pMOS transistors G6, M11 and M12. The source and drain of transistor G6 are respectively connected to BL and BL, the drains of transistors M11 and M12 are tied to VDD, and the sources of transistors M11 and M12 are connected to !BL and BL, respectively. The CL signal drives the gates of transistors G6, M11 and M12. M11 and M12 are suitably 3-4 times larger than G1 and G2.

Figure 5:
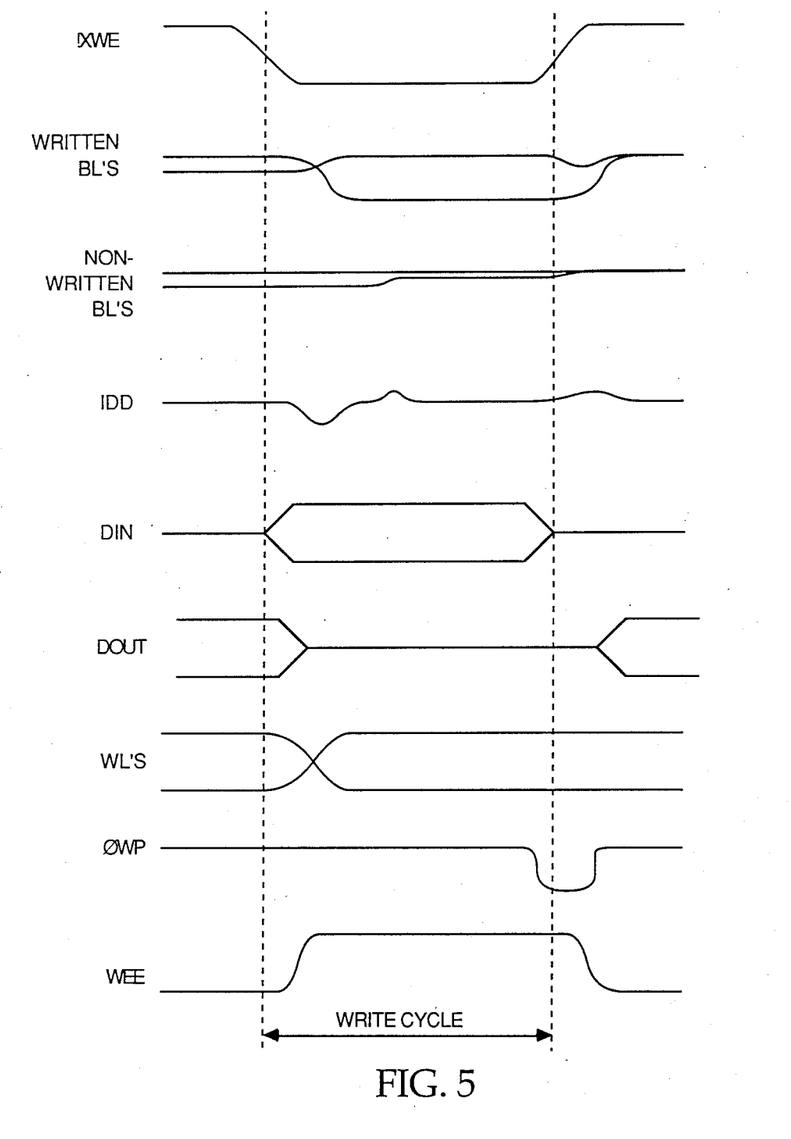
FIG. 5 is a timing diagram illustrating behavior of various signals in the circuit of FIG. 4 during a write cycle and portions of a read cycle.

FIG. 5 is a timing diagram illustrating behavior of signals within the circuit of FIG. 4. During the write cycle, transistors M11 and M12 of all non-addressed columns drive the !BL and BL bit lines of the column near VDD, thereby preventing these bit lines from swinging very far toward VSS. The non-written memory cells are able to only weakly bias the bit lines in accordance with the states of their stored data bits. Therefore, during the first portion of the following read cycle, current passing through transistors M9 and M10 need only charge the capacitance of the single written bit line, and the current spike in IDD is substantially smaller than in the prior art memory circuit of FIG. 2. The reduction in current spike amplitude provides a substantial reduction in noise and rated power consumption of the memory. For the prior art memory of FIG. 2 and for the improved memory of FIG. 4, the instantaneous current due to bit line charging is $$i = (C_{BL}dV_{WBL}/dt_{WR})(N_{WL}) + (C_{BL}dV_{NWBL}/dt_{WR})(N_{NWBL}) \quad (1)$$

where
$dV_{WBL}$ = change in voltage of written bit lines,
$dV_{NWBL}$ = change in voltage of non-written bit lines,
$dt_{WR}$ = write recovery time,
$N_{WBL}$ = number of written bit line pairs,
$N_{NWBL}$ = number of non-written bit line pairs,
$C_{BL}$ = capacitance of each bit line.

In the prior art circuit of FIG. 2, assuming a long write cycle (e.g. greater than 100 ns), $dV_{WBL}$ is approximately equal to $dV_{NWBL}$. Therefore equation (1) reduces to $$i = (C_{BL} dV_{WBL}/dt_{WR})(N_{WL} + N_{NWBL}) \quad (2)$$

For a 64 column array having one pair of written bit lines and 63 non-written pairs of bit lines, and wherein
$C_{BL} = 1$ pf,
$dV_{WBL} = 5.5$ volts, and
$dt = 5$ ns,
$i = (1pf)(5.5v/5ns)(63 + 1) = 70.4$ mA (peak).
Note the non-written bit lines contribute (63/64) or 98.4% of the current spike during the precharge recovery time. This percentage increases with the size of the array.

For the memory of FIG. 4 in accordance with the present invention, $dV_{NWBL}$ is much smaller than $dV_{WBL}$ even for long write cycles. For the 64 column array where
$C_{BL} = 1$ pf,
$dV_{WBL} = 5.5$ volts,
$dV_{NWBL} = 0.2$ volts, and
$dt_{WR} = 5$ ns,
equation (1) becomes $$i = (1pf/5ns) [(5.5v)(1) + (0.2v)(63)]$$
$$= 3.62 \text{ mA (peak)}$$

Thus, by employing transistors M11, M12 and G6 in the memory circuit of FIG. 4, the present invention typically reduces the transient precharge recovery current spike peak from 70.4 mA to 3.62 mA, a 95% reduction.

While the foregoing specification has described a preferred embodiment of the present invention, one skilled in the art may make many modifications to the preferred embodiment without departing from the invention in its broader aspects. The appended claims are therefore intended to cover all such modifications as fall within the true spirit and scope of the invention.

I claim:

1. A random access memory for receiving and storing a data bit during a write cycle and for reading out a stored data bit during a read cycle, the memory comprising:
    a plurality of bit line means;
    a plurality of memory cells connected to separate bit line means and including means for alternatively storing a data bit of a state determined by a bias on selected bit line means and for biasing said selected bit line means in accordance with a state of a data bit stored in a memory cell; and
    input/output means, responsive to an input column address signal identifying one of said memory cells, for clamping bit line means connected to memory cells other than the identified one memory cell to a voltage source during a write cycle, for biasing bit line means connected to the identified memory cell in accordance with a state of an input data bit during said write cycle, and for generating an output data bit in accordance with a bias of selected bit line means connected to the identified memory cell during a read cycle.

2. A random access memory in accordance with claim 1 further comprising precharge means for coupling each of said bit line means to the voltage source through a first impedance during the write cycle and for coupling each bit line means to said voltage source through a second impedance during the read cycle, said first impedance being higher than said second impedance.

3. A random access memory in accordance with claim 1 wherein said input/output means comprises:
    an input/output line;
    a data input circuit connected to said input/output line for receiving said input data bit and biasing said input/output line in accordance with the state of the input data bit during a write cycle;
    a data output circuit connected to said input/output line for generating an output data bit of state determined by a bias on said input/output line during a read cycle;
    decoder means for asserting each of a plurality of output signals, each output signal corresponding to a separate one of said memory cells, said decoder means asserting each output signal when an input address signal identifies the memory cell corresponding to one output signal;
    a plurality of first switch means, each corresponding to a separate one of said output signals, for coupling selected bit line means connected to the corresponding memory cell to the input/output line when the decoder output signal identifying the memory cell is asserted; and
    a plurality of second switch means, each corresponding to separate selected bit line means for selectively coupling corresponding bit line means to said voltage source when the decoder output signal of the decoder corresponding to the selected bit line means is not asserted.

4. A random access memory for receiving and storing an input data bit during a write cycle and reading out a stored data bit during a read cycle, the memory comprising:
    a plurality of bit lines;
    an array comprising rows and columns of memory cells, each memory cell being included in one row and one column, each column of said memory cells corresponding to one of said bit lines;
    means responsive to an input row address signal identifying one of said rows of memory cells for selectively connecting each memory cell of the identified row to a bit line corresponding to the column in which the memory cell is included, each memory cell having means for alternatively storing a data bit of state determined by a bias on the bit line to which it is connected and biasing that bit line in accordance with a state of a data bit stored in the memory cell; and
    input/output means responsive to an input column address signal identifying one of said columns of memory cells for coupling bit lines connected to memory cells other than those forming the identified one column to a voltage source, for receiving said input data bit during the write cycle and biasing a bit line corresponding to the identified column in accordance with a state of said input data bit, and for generating an output data bit in accordance with a bias of the bit line corresponding to the identified column during the read cycle.

5. A random access memory in accordance with claim 4 further comprising precharge means for coupling each of said bit lines to said voltage source through a first impedance during the write cycle and coupling each bit line to said voltage source through a second impedance during the read cycle, said first impedance being larger than said second impedance.

6. A random access memory in accordance with claim 4 wherein said input/output means comprises:
   an input/output line,
   a data input circuit connected to said input/output line for receiving said input data bit and biasing said input/output line in accordance with the state of the input data bit during the write cycle,
   a data output circuit connected to said input/output line for generating an output data bit of state determined by a bias on said input/output line during the read cycle,
   decoder means for producing a plurality of output signals, each output signal corresponding to a separate one of said columns, said decoder means asserting any one output signal when the input column address signal identifies the column corresponding to the one output signal,
   a plurality of first switch means, each corresponding to a separate one of said columns and selectively coupling the bit line corresponding to that one column to the input/output line when the decoder means output signal identifying the one column is asserted; and
   a plurality of second switch means, each corresponding to a separate one of said columns for selectively coupling the bit line corresponding to that one column to the voltage source when the decoder means output signal corresponding to that one column is not asserted.

7. A random access memory for receiving and storing a data bit during a write cycle and reading out a stored data bit during a read cycle, the memory comprising:
   a plurality of bit line pairs;
   precharge means for coupling each bit line to a voltage source through first impedance during the write cycle and coupling each bit line to said voltage source through second impedance during the read cycle, said first impedance being higher than said second impedance.
   an array comprising rows and columns of memory cells, each memory cell being included in one row and one column, each column of memory cells corresponding to a separate one of said bit line pairs;
   means responsive to an input row address signal identifying one of said rows of memory cells for selectively connecting memory cells of the identified row to the bit line pairs of the column in which the memory cell is included; and
   input/output means responsive to an input column address signal identifying one of said columns of memory cells for clamping bit line pairs connected to memory cells other than those forming the identified one column to a voltage source, for biasing a bit line pair corresponding to the identified column in accordance with a state of an input data bit during the write cycle, and for generating an output data bit in accordance with a bias of the bit line pair corresponding to the identified one column during the read cycle;
   wherein each memory cell includes means for storing a data bit of state determined by a bias placed on a bit line pair by said input/output means during a write cycle when the memory cell is connected to that bit line pair, and for otherwise biasing a bit line pair to which it is connected in accordance with a state of a data bit stored in the memory cell.

8. A random access memory in accordance with claim 7 wherein said input/output means comprises:
   an input/output line pair;
   a data input circuit connected to said input/output line pair for receiving said input data bit and biasing said input/output line pair in accordance with the state of the input data bit during the write cycle;
   a data output circuit connected to said input/output line pair for generating an output data bit of state determined by a bias on said input/output line pair during the read cycle;
   decoder means for generating a plurality of output signals, each output signal corresponding to a separate one of said columns, said decoder means asserting any one output signal when the input column address signal identifies a column corresponding to the one output signal,
   a plurality of first switch means, each corresponding to a separate one of said columns and selectively coupling the bit line pair corresponding to the one column to the input/output line pair in response to assertion of the decoder means output signal identifying the one column; and
   a plurality of second switch means, each corresponding to a separate one of said bit line pairs and selectively coupling its corresponding bit line pair to the voltage source when the decoder means output signal identifying that column is not asserted.

9. The memory cell in accordance with claim 7 wherein said precharge means comprises:
   a plurality of first transistors for continuously coupling said bit line pairs to the voltage source; and
   a plurality of second transistors selectively coupling said bit line pairs to said voltage source in response to an input read/write control signal.

10. The memory cell in accordance with claim 9 further comprising a plurality of third transistors for selectively coupling the bit line pairs to said voltage source in response to an input write prebias control signal.

* * * * *